United States Patent
Yu (10) Patent No.: US 12,459,133 B2
(45) Date of Patent: Nov. 4, 2025

(54) WAFER SUSPENSION FORK

(71) Applicant: Sheng Chuan Technology Co., Ltd., Taoyuan (TW)

(72) Inventor: Tsung-Che Yu, Taoyuan (TW)

(73) Assignee: SHENG CHUAN TECHNOLOGY CO., LTD., Taoyuan (TW)

( * ) Notice: Subject to any disclaimer, the term of this patent is extended or adjusted under 35 U.S.C. 154(b) by 819 days.

(21) Appl. No.: 17/836,666

(22) Filed: Jun. 9, 2022

(65) Prior Publication Data

US 2022/0402145 A1 Dec. 22, 2022

(30) Foreign Application Priority Data

Jun. 16, 2021 (TW) ................................ 110121814

(51) Int. Cl.
  *B65G 47/00* (2006.01)
  *B25J 15/00* (2006.01)
  *B65G 47/90* (2006.01)

(52) U.S. Cl.
  CPC .......... *B25J 15/0033* (2013.01); *B65G 47/90* (2013.01)

(58) Field of Classification Search
  CPC .............. B65H 47/911; H01L 21/6838; H01L 21/68707
  See application file for complete search history.

(56) References Cited

U.S. PATENT DOCUMENTS

| | | | | |
|---|---|---|---|---|
| 6,322,116 B1* | 11/2001 | Stevens | ............... | H01L 21/6838 414/941 |
| 7,100,954 B2* | 9/2006 | Klein | ................... | H01L 21/6838 414/222.01 |
| 7,878,562 B2* | 2/2011 | Hamano | ........... | H01L 21/68707 294/902 |
| 2008/0129064 A1* | 6/2008 | Harvey | ............... | H01L 21/6838 294/64.3 |
| 2010/0135761 A1* | 6/2010 | Hebiishi | ........... | H01L 21/67742 414/783 |
| 2011/0236171 A1* | 9/2011 | Yamamoto | .......... | H01L 21/6838 414/800 |

(Continued)

FOREIGN PATENT DOCUMENTS

| | | | | |
|---|---|---|---|---|
| CN | 114628251 A | * | 6/2022 | ............. H01L 21/78 |
| CN | 117080147 A | * | 11/2023 | ......... H01L 21/6838 |

(Continued)

*Primary Examiner* — Emmanuel M Marcelo
(74) *Attorney, Agent, or Firm* — Bradley J. Thorson; DeWitt LLP (57) ABSTRACT

A wafer suspension fork has a body and a cover. The body has a connection portion having multiple inlets and two arms being symmetrical in shape and protruding from the connection portion. Each arm has a holding surface, a flowing surface, multiple inner and outer inclined holes formed in the holding surface arranged along a protruding direction, an inner flowing channel formed in the flowing surface and communicating with the inner inclined holes and the inlets, and an outer flowing channel formed in the flowing surface and communicating with the outer inclined holes and the inlets. The cover is fixed to a bottom surface of the body. A wafer is able to be suspended and held above the two arms by adjusting pressure of gas flowing out from the inner and outer inclined holes and is able to be moved free from being scratched.

20 Claims, 8 Drawing Sheets

(56) References Cited

U.S. PATENT DOCUMENTS

2024/0276647 A1\* 8/2024 Peng .................... B25J 15/0014

FOREIGN PATENT DOCUMENTS

| | | | | | |
|---|---|---|---|---|---|
| CN | 117594512 | A | \* | 2/2024 | ....... H01L 21/67742 |
| JP | H06349933 | A | \* | 12/1994 | |
| JP | 2006179836 | A | \* | 7/2006 | |
| JP | 2007273731 | A | \* | 10/2007 | |
| JP | 4016622 | B2 | \* | 12/2007 | |
| JP | 2009154213 | A | \* | 7/2009 | ....... H01L 21/68707 |
| JP | 5188952 | B2 | | 4/2013 | |
| JP | 2014130899 | A | \* | 7/2014 | |
| JP | 2019026465 | A | \* | 2/2019 | |
| KR | 20090095618 | A | \* | 9/2009 | ....... H01L 21/68707 |
| KR | 20110140053 | A | \* | 12/2011 | ........... B65G 49/065 |
| TW | 201135863 | A | | 10/2011 | |
| TW | M542239 | U | \* | 5/2017 | |
| TW | M605823 | U | | 12/2020 | |
| WO | WO-2008070302 | A2 | \* | 6/2008 | ....... H01L 21/68707 |

\* cited by examiner

WAFER SUSPENSION FORK

BACKGROUND OF THE INVENTION

1. Field of the Invention

The present invention relates to a wafer fork, and more particularly to a wafer suspension fork blowing gas to suspend and secure a wafer thereon.

2. Description of Related Art

A vacuum fork is a mechanism of a conventional wafer processing equipment for holding and moving a wafer. The vacuum fork has a fork body and multiple suction cups. The fork body has multiple flowing channels formed therein and communicating with a vacuum pump. The suction cups are mounted on the fork body and communicate with the flowing channels. The wafer is sucked by the suction cups of the vacuum fork and is held thereon when the vacuum pump evacuates air, and thereby the wafer can be moved by the vacuum fork.

However, the wafer held by suction mentioned above is prone to scratching because of relative movement and rubbing between the wafer and the vacuum fork. The wafer yield drops accordingly.

To overcome the shortcomings, the present invention provides a wafer suspension fork to mitigate or obviate the aforementioned problems.

SUMMARY OF THE INVENTION

The main objective of the present invention is to provide a wafer suspension fork having multiple inner inclined holes and multiple outer inclined holes formed in two arms for ejecting gas to make a wafer suspend and held thereon.

The wafer suspension fork comprises a body and a cover. The body has a connection portion and two arms. The connection portion has a top surface, a bottom surface, and multiple inlets formed in the top surface of the connection portion. The two arms are symmetrical in shape, are spaced from each other, and protrude from a side of the connection portion. Each of the two arms has an inner surface facing to the other one of the two arms, an outer surface facing opposite to the other one of the two arms, a holding surface, a flowing surface, multiple outer inclined holes, multiple inner inclined holes, an inner flowing channel, and an outer flowing channel. The holding surface is defined on a top of the arm and inclines downwardly from the outer surface of the arm and to the inner surface of the arm. The flowing surface is defined on a bottom of the arm. The multiple outer inclined holes of each of the two arms are formed in the holding surface of the arm, are located near the outer surface of the arm, are arranged along a protruding direction of the arm, and are spaced from one another. Each of the outer inclined holes of each of the two arms obliquely extends from the holding surface toward the flowing surface and toward the inner surface of the arm. The multiple inner inclined holes of each of the two arms are formed in the holding surface of the arm, are located near the inner surface of the arm, are arranged along a protruding direction of the arm, and are spaced from one another. Each of the inner inclined holes of each of the two arms obliquely extends from the holding surface toward the flowing surface and toward the outer surface of the arm. The inner flowing channel is formed in the flowing surface and communicates with the inner inclined holes and the inlets. The outer flowing channel is formed in the flowing surface and communicates with the outer inclined holes and the inlets. The cover is fixed to the bottom surface of the connection portion and the flowing surfaces of the two arms and covers the inner flowing channel and the outer channel of the two arms.

A wafer is able to be suspended and held above the two arms by adjusting pressure of gas flowing out from the inner and outer inclined holes and is able to be moved free from being scratched.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
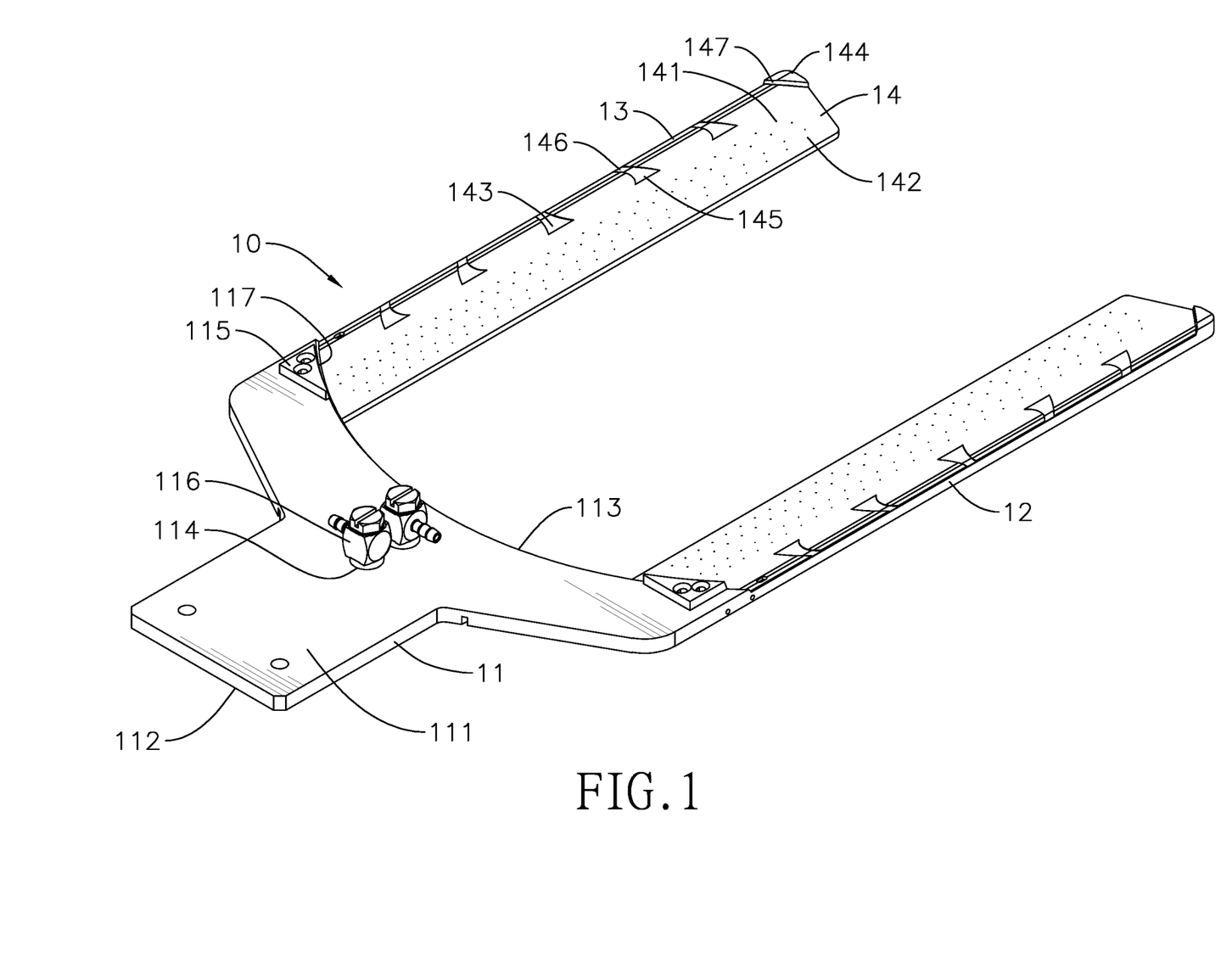
FIG. 1 is a perspective view of a wafer suspension fork in accordance with the present invention.
Figure 2:
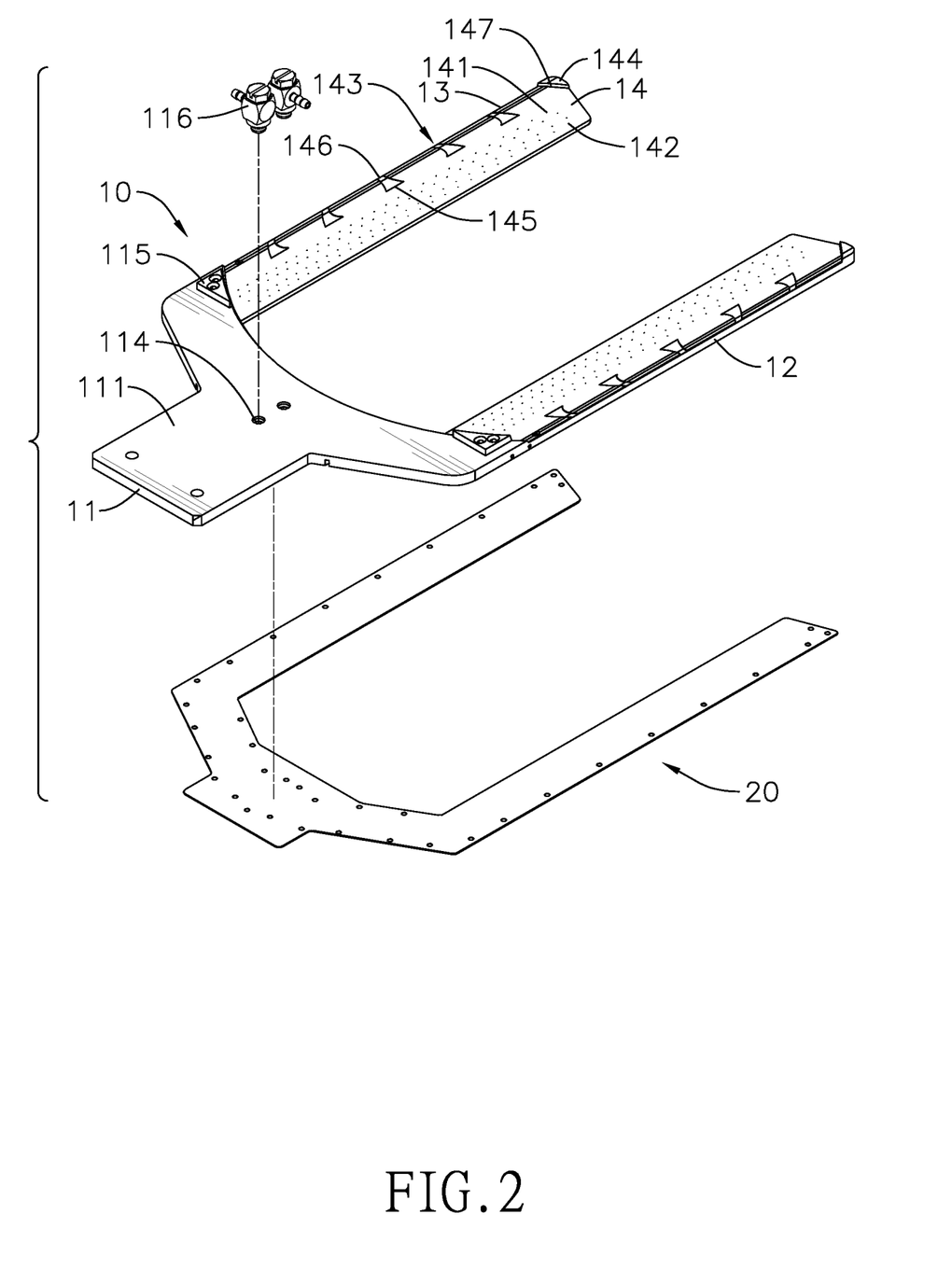
FIG. 2 is an exploded perspective view of the wafer suspension fork in FIG. 1.

With reference to FIGS. 1 and 2, a wafer suspension fork in accordance with the present invention has a body 10 and a cover 20.

Figure 5:
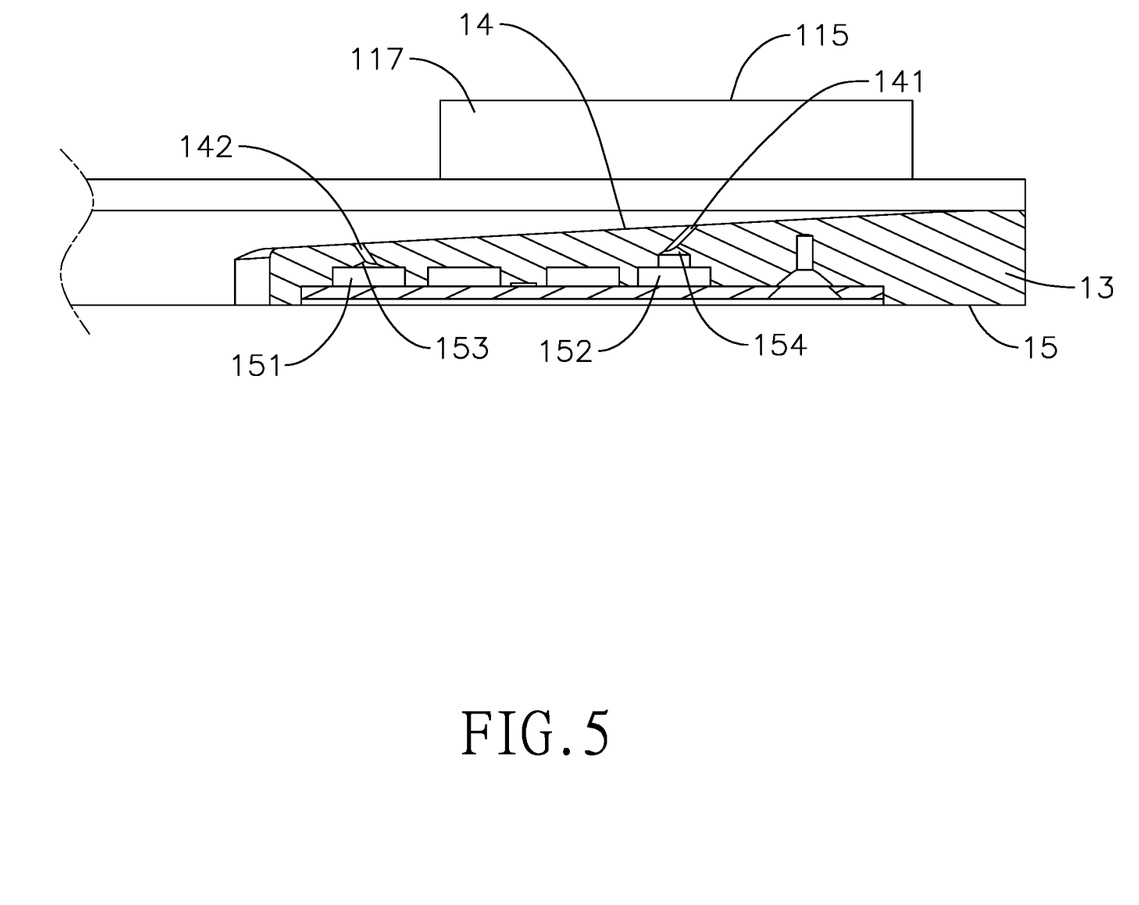
FIG. 5 is an enlarged cross sectional front view of the wafer suspension fork in FIG. 1.

With reference to FIGS. 1, 2, and 5, the body 10 has a connection portion 11 and two arms 12, 13. The connection portion 11 is a plate and has a top surface 111, a bottom surface 112, and a front surface 113. The top surface 111 and the bottom surface 112 are two opposite surfaces respectively located on a top and a bottom of the connection portion 11. The front surface 113 is located between the top surface 111 and the bottom surface 112 and is a concave surface. Multiple inlets 114 are formed in the top surface 111. Multiple first positioning blocks 115 are formed on the top surface 111. A connector 116 is assembled to each of the inlets 114. The connector 116 assembled to each of the inlets 114 is configured to communicate with a gas supply line. In the embodiment of the present invention, the multiple first positioning blocks 115 are two first positioning blocks 115 respectively located near the two arms 12, 13. Each first positioning block 115 has a first abutting surface 117 being near the front surface 113 and aligned with the front surface 113.

The two arms 12, 13 are symmetrical in shape, are spaced from each other, and protrude from a side of the connection portion 11. Specifically, the two arms 12, 13 are respectively defined as a right arm 12 and a left arm 13 horizontally protruding from the front surface 113 of the connection portion 11. Each of the right arm 12 and the left arm 13 has an inner surface near an inner surface of the other and an outer surface away from the inner surface of the other. That is, the inner surfaces of the right and the left arms 12, 13 face to each other and the outer surfaces of the right and the left arms 12, 13 face to opposite directions. The right arm 12 and the left arm 13 are the same in structure and are symmetrical in shape, and only the left arm 13 is illustrated below.

The left arm 13 has a holding surface 14 defined on a top thereof and a flowing surface 15 defined on a bottom thereof. The holding surface 14 inclines downwardly from the outer surface of the left arm 13 to the inner surface of the left arm 13. Multiple outer inclined holes 141, multiple inner inclined holes 142, and multiple collecting recesses 143 are formed in the holding surface 14.

Each of the outer inclined holes 141 of the left arm 13 is formed through the holding surface 14 and obliquely extends from the holding surface 14 toward the flowing surface 15 and toward the inner surface of the left arm 13. The multiple outer inclined holes 141 are located near the outer surface of the left arm 13 and are arranged along a protruding direction of the left arm 13, and are spaced from one another. In this embodiment, the left arm 13 has two rows of the outer inclined holes 141 in a staggered arrangement. The outer inclined holes 141 in each of the two rows of the outer inclined holes 141 have inner diameters gradually increasing from an end of the row of the outer inclined holes 141 near the connection portion 11 toward an end of the row of the outer inclined holes 141 away from the connection portion 11. Preferably, the inner diameter of each of the outer inclined holes 141 ranges from 0.1 to 0.3 millimeters. An included angle formed between an axis of each of the outer inclined holes 141 and the flowing surface 15 ranges from 25 to 50 degrees but is not limited thereto. The configuration and the arrangement of the outer inclined holes 141 can be changed according to the needs of the users.

Figure 4:
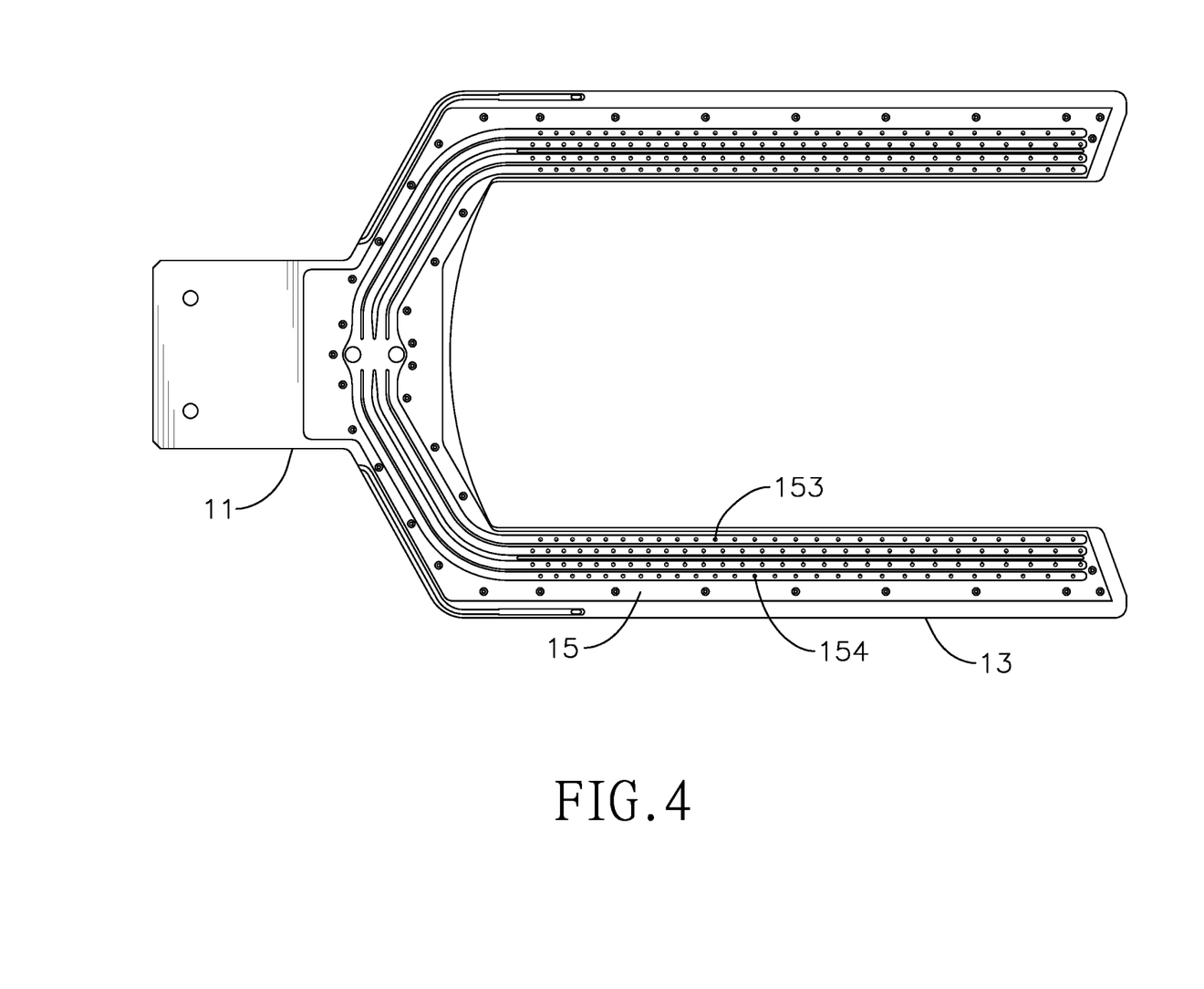
FIG. 4 is a bottom view of the wafer suspension fork in FIG. 1.
Figure 6:
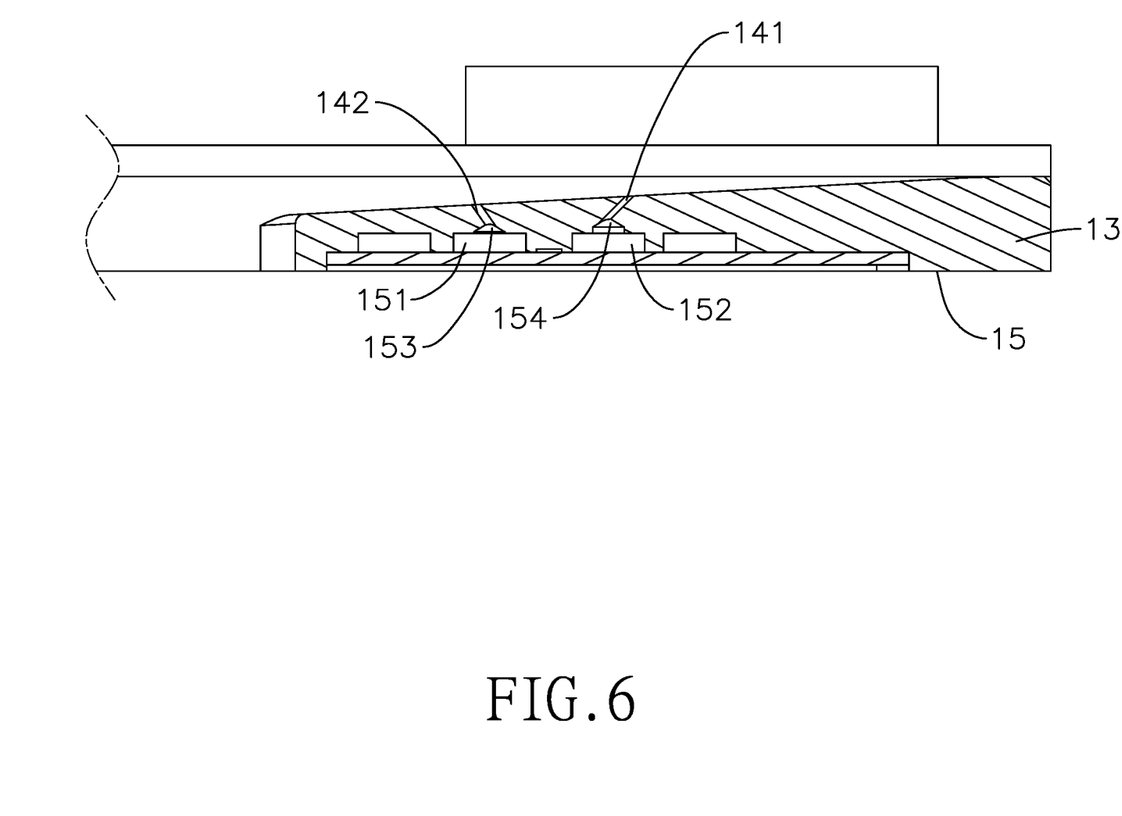
FIG. 6 is another enlarged cross sectional front view of the wafer suspension fork in FIG. 1.

With reference to FIGS. 1, 4, and 6, each of the inner inclined holes 142 of the left arm 13 is formed through the holding surface 14 and obliquely extends from the holding surface 14 toward the flowing surface 15 and toward the outer surface of the left arm 13. The inner inclined holes 142 are located near the inner surface of the left arm 13, are arranged along the protruding direction of the left arm 13, and are spaced from one another. In this embodiment, the left arm 13 has two rows of the inner inclined holes 142 in a staggered arrangement. The inner inclined holes 142 in each of the two rows of the inner inclined holes 142 have inner diameters gradually increasing from an end of the row of the inner inclined holes 142 near the connection portion 11 to an end of the row of the outer inclined holes 141 away from the connection portion 11. Preferably, the inner diameter of each of the inner inclined holes 142 ranges from 0.1 to 0.3 millimeters. An included angle formed between an axis of each of the inner inclined holes 142 and the flowing surface 15 ranges from 25 to 50 degrees, but is not limited thereto. The configuration and the arrangement of the inner inclined holes 142 can be changed according to the need of the users.

With reference to FIG. 1, the collecting recesses 143 of the left arm 13 are recessed in the holding surface 14 at spaced intervals and are located near the outer surface of the left arm 13. Each of the collecting recesses 143 has an input opening 145 near the outer inclined holes 141 and an output opening 146 near the outer surface of the left arm 13. Each of the collecting recesses 143 has opposite two sides gradually approaching each other from the input opening 145 to the output opening 146 as a convergent passage. That is, each of the collecting recesses 143 has a width defined between the two sides of the collecting recess 143 and gradually decreasing from the input opening 145 to the output opening 146 of the collecting recesses 143. In the embodiment, the left arm 13 has five collecting recesses 143 arranged along the protruding direction of the left arm 13. Each of the collecting recesses 143 has an output direction defined from the input opening 145 to the output opening 146. The output direction of a middle one of the five collecting recesses 143 is perpendicular to the outer surface of the left arm 13. The output directions of the others of the five collecting recesses 143 respectively converge toward the middle one of the collecting recesses 143, but are not limited thereto. Whether the collecting recesses 143 exist or not can be determined according to the need of the users. An amount of or shapes of the collecting recesses 143 can be adjusted according to the need of the users as well.

Two second positioning blocks 144 are respectively formed on the holding surfaces 14 of the two arms 12, 13 and are respectively located at the ends of the two arms 12, 13 away from the connection portion 11. Each of the two second positioning blocks 144 has a second abutting surface 147 being a concave surface and located near the inner surface of each of the two arms 12, 13. The second abutting surface 147 corresponds to the front surface 113 in shape.

Figure 3:
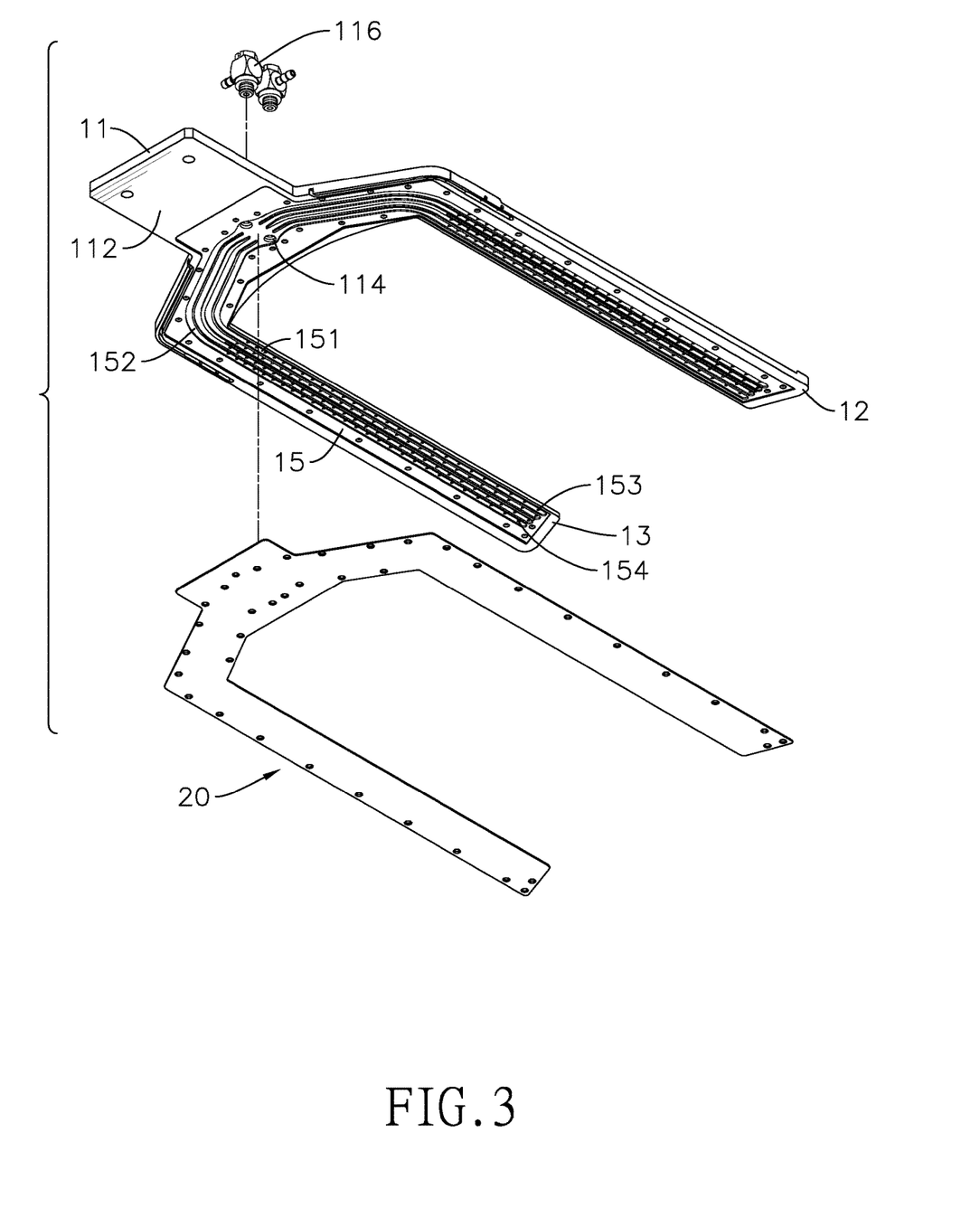
FIG. 3 is another exploded perspective view of the wafer suspension fork in FIG. 1.

With reference to FIGS. 3 and 4, an inner flowing channel 151, an outer flowing channel 152, multiple inner tapered holes 153, and multiple outer tapered holes 154 are formed in the flowing surface 15 of the left arm 13. The inner flowing channel 151 is located near the inner surface of the left arm 13, extends along the protruding direction of the left arm 13, and communicates with the inner inclined holes 142 and the inlets 114. The outer flowing channel 152 is located near the outer surface of the left arm 13, extends along the protruding direction of the left arm 13, and communicates with the outer inclined holes 141 and the inlets 114. Each of the inner tapered holes 153 communicates with the inner flowing channel 151 and a respective one of the inner inclined holes 142 and tapers to the holding surface 14. Each of the outer tapered holes 154 communicates with the outer flowing channel 152 and a respective one of the outer inclined holes 141.

The cover 20 is a sheet and is fixed to the bottom surface 112 of the connection portion 11 and the flowing surfaces 15 of the right arm 12 and the left arm 13 and covers the inner flowing channel 151 and the outer flowing channel 152 of the right arm 12 and the left arm 13 to form chambers enclosed by the inner flowing channel 151, the outer flowing channel 152, and the cover 20.

Figure 7:
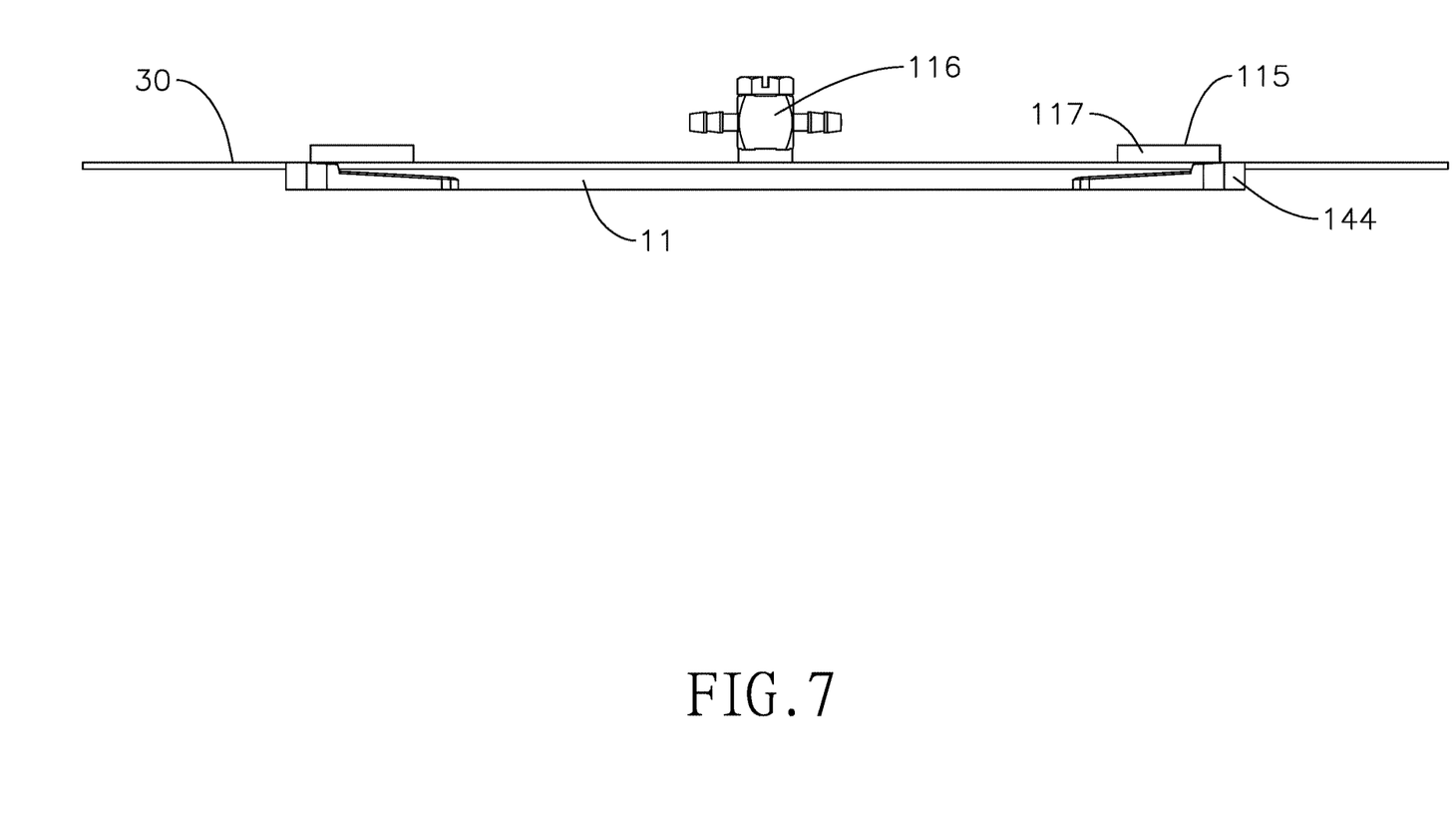
FIG. 7 is an operational front view of the wafer suspension fork in FIG. 1.

With reference to FIGS. 1, 4, and 7, when the wafer suspension fork in accordance with the present invention is in use, the connection portion 11 is connected to a robotic arm, and the connectors 116 are connected with the gas supply line. After the wafer suspension fork in accordance with the present invention is moved to one side of a wafer 30, gas from the gas supply line is introduced into the inlets 114 and flows to the inner flowing channel 151 and the outer flowing channel 152. The gas flowing in the inner flowing channel 151 and the outer flowing channel 152 respectively flows out from the outer inclined holes 141 and inner inclined holes 142. Specifically, in the embodiment of the present invention, there are two inner flowing channels 151 located near the inner surface of each arm 12/13 and two outer flowing channels 152 located near the outer surface of each arm 12/13 in FIGS. 3 to 6. The inner flowing channels 151 communicate with the multiple inner inclined holes 142 and the multiple inlets 114. The outer flowing channels 152 communicate with the multiple outer inclined holes 141 and the multiple inlets 114. The amounts of the inner flowing channels 151 and the outer flowing channels 152 are not restricted.

Figure 8:
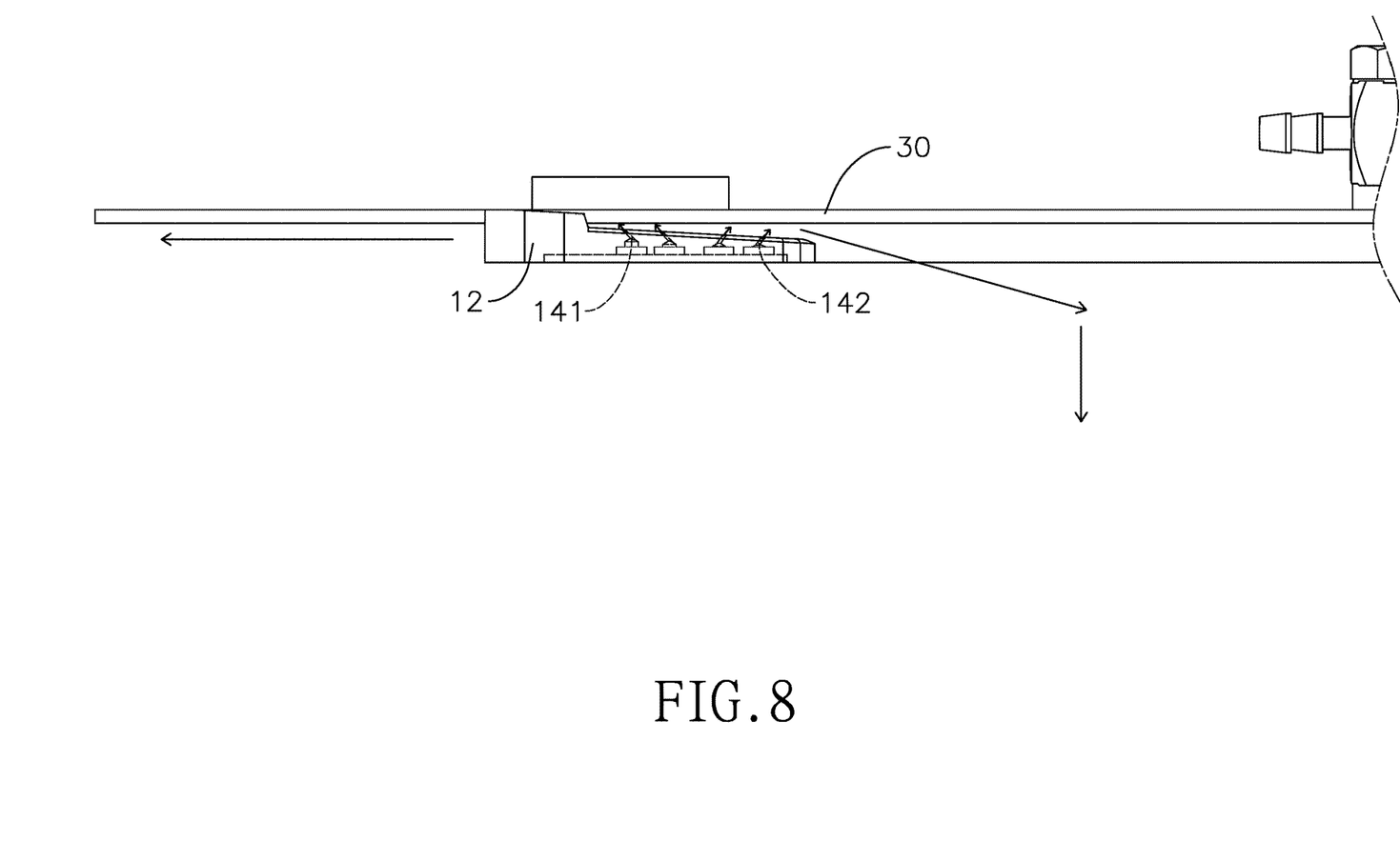
FIG. 8 is an enlarged operational front view of the wafer suspension fork in FIG. 7.

With reference to FIGS. 1, 7, and 8, the gas flowing out from the inner inclined holes 142 of the right and left arms 12, 13 hits the wafer 30 and obliquely flows down to a region between the right and left arms 12, 13. The gas from the inner inclined holes 142 of the right and left arms 12, 13 encounters and forms a lower-pressure region beneath the wafer 30.

The gas flowing out from the outer inclined holes 141 of the right arm 12 is compressed in a narrow space between the right arm 12 and the wafer 30, is speeded up, and laterally flows out. A part of the gas from the outer inclined holes 141 of the right arm 12 flows through the collecting recesses 143 and is speeded up again by the convergent output openings 146 of the collecting recesses 143. According to Bernoulli's principle, the pressure of the high-speed gas is lower than the pressure of the low-speed gas. Because the speed of the gas below the wafer 30 is higher than the speed of the gas above the wafer 30, the pressure beneath the wafer 30 created by the gas flowing out from the outer inclined holes 141 is lower than the pressure above the wafer 30 created by the gas flowing out from the outer inclined holes 141. Moreover, the low-pressure region is formed between the left arm 13 and the right arm 12, so the gas pressure above the wafer 30 is higher than the gas pressure below the wafer 30. Accordingly, a force is created to push the wafer 30 toward the wafer suspension fork in accordance with the present invention. In addition, the pressure of the gas flowing out from the inner inclined holes 142 and the outer inclined holes 141 can be adjusted to equalize the upper pressure and the lower pressure of the wafer 30. Therefore, the wafer 30 can suspend above the left arm 13 and the right arm 12 to move the wafer 30 without contact and to prevent the wafer 30 from being scratched during movement.

With reference to FIGS. 1 and 7, because the wafer suspension fork has the first positioning blocks 115 and the second positioning blocks 144 formed thereon, a rim of the wafer 30 can abut on and be restricted between the first abutting surfaces 117 of the first positioning blocks 115 and the second abutting surfaces 147 of the second positioning blocks 144 to prevent the wafer 30 from being laterally thrown away from the wafer suspension fork of the present invention.

The wafer suspension fork in accordance with the present invention has advantages as follows: the wafer 30 is suspended and held on the left arm 13 and the right arm 12 by adjusting the pressure of gas flowing out from the inner and outer inclined holes 142, 141. The wafer 30 can be moved free from being touched and scratched. The first positioning blocks 115 and the second positioning blocks 144 can abut on the rim of the wafer 30 to prevent the wafer 30 from being laterally thrown away from the wafer suspension fork of the present invention.

What is claimed is:

1. A wafer suspension fork comprising:
a body and a cover, wherein
the body has a connection portion and two arms;
the connection portion has a top surface, a bottom surface, and multiple inlets formed in the top surface of the connection portion; and
the two arms are symmetrical in shape, are spaced from each other, and protrude from a side of the connection portion;
each of the two arms has
an inner surface facing to the other one of the two arms;
an outer surface facing opposite to said the other one of the two arms;
a holding surface defined on a top of the arm and inclining downwardly from the outer surface of the arm to the inner surface of the arm;
a flowing surface defined on a bottom of the arm;
multiple outer inclined holes formed in the holding surface of the arm, located near the outer surface of the arm, arranged along a protruding direction of the arm, and spaced from one another;
each of the multiple outer inclined holes of the arm obliquely extending from the holding surface toward the flowing surface and toward the inner surface of the arm;
multiple inner inclined holes formed in the holding surface of the arm, located near the inner surface of the arm, arranged along the protruding direction of the arm, and spaced from one another;
each of the inner inclined holes of the arm obliquely extending from the holding surface toward the flowing surface and toward the outer surface of the arm;
an inner flowing channel formed in the flowing surface and communicating with the multiple inner inclined holes and the multiple inlets; and
an outer flowing channel formed in the flowing surface and communicating with the multiple outer inclined holes and the multiple inlets; and
the cover is fixed to the bottom surface of the connection portion and the flowing surfaces of the two arms and covers the inner flowing channel and the outer flowing channel of the two arms.

2. The wafer suspension fork as claimed in claim 1, wherein each of the two arms has multiple collecting recesses formed in the holding surface of the arm, arranged along the protruding direction of the arm at spaced intervals, and located near the outer surface of the arm; and
each of the multiple collecting recesses of each arm has opposite two sides and a width defined between the two sides gradually decreasing from the inner surface of the arm toward the outer surface of the arm.

3. The wafer suspension fork as claimed in claim 2, wherein
each of the multiple collecting recesses of each of the two arms has
an input opening disposed near the outer inclined holes;
an output opening disposed near the outer surface of the arm; and
an output direction defined from the input opening of the collecting recess to the output opening of the collecting recess;
the multiple collecting recesses of each of the two arms are five collecting recesses;
the output direction of a middle one of the five collecting recesses of each of the two arms is perpendicular to the outer surface of the arm; and
the output directions of the others of the five collecting recesses of each of the two arms converge toward the middle one of the collecting recesses of the arm.

4. The wafer suspension fork as claimed in claim 3, wherein
multiple inner tapered holes are formed in the flowing surface of each of the two arms;
each of the inner tapered holes formed in the flowing surface of each of the two arms communicates with a respective one of the inner inclined holes and the inner flowing channel of the arm;

multiple outer tapered holes are formed in the flowing surface of each of the two arms; and each of the outer tapered holes formed in the flowing surface of each of the two arms communicates with a respective one of the outer inclined holes and the outer flowing channel of the arm.

5. The wafer suspension fork as claimed in claim 4, wherein the wafer suspension fork has two first positioning blocks and two second positioning blocks;

the two first positioning blocks are formed on the top surface of the connection portion and are respectively located near the two arms;

the two second positioning blocks are respectively formed on the holding surfaces of the two arms and are respectively located at ends of the two arms away from the connection portion.

6. The wafer suspension fork as claimed in claim 5, wherein the connection portion has a front surface located between the top surface and the bottom surface of the connection portion and being a concave surface;

each of the two first positioning blocks has a first abutting surface located near the front surface and aligned with the front surface of the connection portion.

7. The wafer suspension fork as claimed in claim 2, wherein multiple inner tapered holes are formed in the flowing surface of each of the two arms;

each of the inner tapered holes formed in the flowing surface of each of the two arms communicates with a respective one of the inner inclined holes and the inner flowing channel of the arm;

multiple outer tapered holes are formed in the flowing surface of each of the two arms; and each of the outer tapered holes formed in the flowing surface of each of the two arms communicates with a respective one of the outer inclined holes and the outer flowing channel of the arm.

8. The wafer suspension fork as claimed in claim 5, wherein the wafer suspension fork has two first positioning blocks and two second positioning blocks;

the two first positioning blocks are formed on the top surface of the connection portion and are respectively located near the two arms;

the two second positioning blocks are respectively formed on the holding surfaces of the two arms and are respectively located at ends of the two arms away from the connection portion.

9. The wafer suspension fork as claimed in claim 8, wherein the connection portion has a front surface located between the top surface and the bottom surface of the connection portion and being a concave surface;

each of the two first positioning blocks has a first abutting surface located near the front surface and aligned with the front surface of the connection portion.

10. The wafer suspension fork as claimed in claim 9, wherein each of the two second positioning blocks has a second abutting surface being a concave surface and located near the inner surface of each of the two arms; and the second abutting surface of each of the two second positioning blocks corresponds to the front surface of the connection portion in shape.

11. The wafer suspension fork as claimed in claim 10, wherein each of the two arms has two rows of the said multiple outer inclined holes in a staggered arrangement;

the outer inclined holes in each of the two rows of the outer inclined holes of each of the two arms have inner diameters gradually increasing from an end of the row of the outer inclined holes near the connection portion to an end of the row of the outer inclined holes away from the connection portion;

each of the two arms has two rows of the said multiple inner inclined holes in a staggered arrangement; and the inner inclined holes in each of the two rows of the inner inclined holes of each of the two arms have inner diameters gradually increasing from an end of the row of the inner inclined holes near the connection portion to an end of the row of the inner inclined holes away from the connection portion.

12. The wafer suspension fork as claimed in claim 11, wherein an included angle is defined between an axis of each of the multiple inner inclined holes of each of the two arms and the flowing surface of the arm and ranges from 25 to 50 degrees; and an included angle is defined between an axis of each of the multiple outer inclined holes of each of the two arms and the flowing surface of the arm and ranges from 25 to 50 degrees.

13. The wafer suspension fork as claimed in claim 12, wherein the inner diameter of each of the multiple inner inclined holes of each of the two arms ranges from 0.1 mm to 0.3 mm; and the inner diameter of each of the multiple outer inclined holes of each of the two arms ranges from 0.1 mm to 0.3 mm.

14. The wafer suspension fork as claimed in claim 1, wherein multiple inner tapered holes are formed in the flowing surface of each of the two arms;

each of the inner tapered holes formed in the flowing surface of each of the two arms communicates with a respective one of the inner inclined holes and the inner flowing channel of the arm;

multiple outer tapered holes are formed in the flowing surface of each of the two arms; and each of the outer tapered holes formed in the flowing surface of each of the two arms communicates with a respective one of the outer inclined holes and the outer flowing channel of the arm.

15. The wafer suspension fork as claimed in claim 14, wherein the wafer suspension fork has two first positioning blocks and two second positioning blocks;

the two first positioning blocks are formed on the top surface of the connection portion and are respectively located near the two arms;

the two second positioning blocks are respectively formed on the holding surfaces of the two arms and are respectively located at ends of the two arms away from the connection portion.

16. The wafer suspension fork as claimed in claim 15, wherein the connection portion has a front surface located between the top surface and the bottom surface of the connection portion and being a concave surface;

each of the two first positioning blocks has a first abutting surface located near the front surface and aligned with the front surface of the connection portion.

17. The wafer suspension fork as claimed in claim 16, wherein each of the two second positioning blocks has a second abutting surface being a concave surface and located near the inner surface of each of the two arms; and the second abutting surface of each of the two second positioning blocks corresponds to the front surface of the connection portion in shape.

18. The wafer suspension fork as claimed in claim 17, wherein each of the two arms has two rows of the said multiple outer inclined holes in a staggered arrangement;

the outer inclined holes in each of the two rows of the outer inclined holes of each of the two arms have inner diameters gradually increasing from an end of the row of the outer inclined holes near the connection portion to an end of the row of the outer inclined holes away from the connection portion;

each of the two arms has two rows of the said multiple inner inclined holes in a staggered arrangement; and the inner inclined holes in each of the two rows of the inner inclined holes of each of the two arms have inner diameters gradually increasing from an end of the row of the inner inclined holes near the connection portion to an end of the row of the inner inclined holes away from the connection portion.

19. The wafer suspension fork as claimed in claim 18, wherein an included angle is defined between an axis of each of the multiple inner inclined holes of each of the two arms and the flowing surface of the arm and ranges from 25 to 50 degrees; and an included angle is defined between an axis of each of the multiple outer inclined holes of each of the two arms and the flowing surface of the arm and ranges from 25 to 50 degrees.

20. The wafer suspension fork as claimed in claim 19, wherein the inner diameter of each of the multiple inner inclined holes of each of the two arms ranges from 0.1 mm to 0.3 mm; and the inner diameter of each of the multiple outer inclined holes of each of the two arms ranges from 0.1 mm to 0.3 mm.

\* \* \* \* \*